United States Patent
Hunze et al.

(10) Patent No.: US 8,154,200 B2
(45) Date of Patent: Apr. 10, 2012

(54) ENCAPSULATION OF ORGANIC DEVICES

(75) Inventors: Arvid Hunze, Erlangen (DE); Debora Henseler, Erlangen (DE); Karsten Heuser, Erlangen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 226 days.

(21) Appl. No.: 12/290,708

(22) Filed: Nov. 3, 2008

(65) Prior Publication Data

US 2009/0066240 A1    Mar. 12, 2009

Related U.S. Application Data

(63) Continuation of application No. 11/141,476, filed on May 31, 2005, now abandoned.

(60) Provisional application No. 60/627,905, filed on Nov. 15, 2004.

(51) Int. Cl.
*H05B 33/04* (2006.01)
(52) U.S. Cl. ............................ 313/512; 445/25; 313/504
(58) Field of Classification Search ................ 313/504, 313/509, 512; 445/25; 257/40; 438/39, 438/127
See application file for complete search history.

(56) References Cited

U.S. PATENT DOCUMENTS

| | | | |
|---|---|---|---|
| 3,737,625 A | 6/1973 | Martin | |
| 5,843,265 A | 12/1998 | Grimm | |
| 6,692,610 B2 | 2/2004 | Low et al. | |
| 6,696,312 B2 | 2/2004 | Guenther et al. | |
| 6,699,728 B2 * | 3/2004 | Guenther et al. | 438/39 |
| 6,784,009 B2 | 8/2004 | Lim et al. | |
| 6,803,245 B2 | 10/2004 | Auch et al. | |
| 6,936,963 B2 * | 8/2005 | Langer et al. | 313/509 |
| 6,998,776 B2 | 2/2006 | Aitken et al. | |
| 7,144,471 B2 | 12/2006 | Kobayashi et al. | |
| 7,365,442 B2 | 4/2008 | Pichler | |
| 2002/0108707 A1 | 8/2002 | Kobayashi et al. | |
| 2003/0062518 A1 * | 4/2003 | Auch et al. | 257/40 |

(Continued)

FOREIGN PATENT DOCUMENTS

| | | |
|---|---|---|
| WO | WO 01/44865 | 6/2001 |
| WO | WO 01/45140 | 6/2001 |

OTHER PUBLICATIONS

The American Heritage Dictionary, Fourth Edition, 2004, Houghton Mifflin Company, p. 536.

*Primary Examiner* — Nimeshkumar Patel
*Assistant Examiner* — Mary Ellen Bowman
(74) *Attorney, Agent, or Firm* — Cozen O'Connor

(57) ABSTRACT

Presented an organic light-emitting device (OLED) that includes at least one active region, at least one organic layer, a first glass plate on which the at least one active region is applied, and a second glass plate. The active region is disposed between the first and the second glass plates. The first and second glass plates are at least partially transparent in the near infrared spectral range. The OLED further includes a bonding material that includes a solder glass and is disposed between the first and second glass plates. The bonding material forms at least one frame that surrounds the active region and mechanically connects the first glass plate with the second glass plate and seals the active region. The bonding material absorbs near infrared radiation. The OLED further includes spacer particles that have a mean diameter that maintains a height between the first and second glass plates.

12 Claims, 5 Drawing Sheets

U.S. PATENT DOCUMENTS

| | | | |
|---|---|---|---|
| 2003/0080678 A1* | 5/2003 | Kim et al. | 313/504 |
| 2004/0048033 A1 | 3/2004 | Klausmann et al. | |
| 2004/0051449 A1* | 3/2004 | Klausmann et al. | 313/512 |
| 2004/0191963 A1* | 9/2004 | Pichler | 438/127 |
| 2005/0001546 A1* | 1/2005 | Yamaguchi | 313/512 |
| 2005/0087290 A1 | 4/2005 | Herold et al. | |
| 2005/0248270 A1* | 11/2005 | Ghosh et al. | 313/512 |

\* cited by examiner

ENCAPSULATION OF ORGANIC DEVICES

CROSS-REFERENCE APPLICATION

This patent application is a continuation of application Ser. No. 11/141,476, filed May 31, 2005 now abandoned, which claims the priority of U.S. provisional patent application Ser. No. 60/627,905, filed Nov. 15, 2004. The disclosure content of both application Ser. Nos. 11/141,476 and 60/627,905 are hereby incorporated by reference.

FIELD OF THE INVENTION

The present invention relates to organic light-emitting devices such as light-emitting diodes (OLEDs).

BACKGROUND OF THE INVENTION

Organic devices such as OLED-devices contain at least one active organic layer on a substrate sandwiched between two electrodes. To protect the active organic layer and other functional parts of the device, a cap is bonded to the substrate with the help of a bonding material. Usually the cap is bonded to the substrate using polymeric adhesives, for example epoxy adhesives, as bonding material. The bonding material fixes the cap on the substrate and acts as a barrier to harmful atmospheric gases such as oxygen and moisture. After mounting the cap on the substrate, the adhesive has to be cured. Many commonly used adhesives can be cured by heat treatment, for example on a hot plate or in an oven. However, heat treatment can damage the active organic layer or other functional parts of the device and can therefore adversely affect the performance of the device. To avoid damaging of the device during the heat treatment, the curing temperatures are generally adjusted to the temperature tolerance of the active organic layer or other functional parts of the device and not only to the curing properties of the bonding material. On the one hand, this can lead to enhanced permeation rates for harmful atmospheric gases of the cured bonding material and on the other hand, limits the number of bonding materials suited for sealing the device. Particularly, higher curing temperatures can allow the use of bonding materials with lower permeation rates for gases like oxygen and moisture.

In U.S. Pat. No. 6,692,610, a method of fabricating devices such as OLED-devices is disclosed. The method includes applying an adhesive on a cap or substrate. The adhesive is partially cured to initiate the cross-linking process while remaining in the liquid phase. The cap is then mounted onto the substrate and the adhesive is cured to encapsulate the device. By partially curing the adhesive prior to mounting the cap, the curing of the adhesive can be achieved without prolonged exposure to UV-radiation or high temperatures, which can adversely impact the device.

However, this method requires a further process step which makes the production of devices more complicated and expensive. Furthermore, the above-mentioned U.S. Pat. No. 6,692,610 does not disclose an alternative to the heat treatment, which would allow the use of bonding material with improved barrier properties.

SUMMARY OF THE INVENTION

According to one aspect, the invention involves an organic light-emitting device. The organic light-emitting device includes at least one active region that includes at least one organic layer, a first glass plate on which the at least one active region is applied, and a second glass plate. The at least one active region is disposed between the first and the second glass plates. The first and the second glass plates are at least partially transparent in the near infrared spectral range. The organic light-emitting device further includes a bonding material that includes a solder glass and is disposed between the first and the second glass plates. The bonding material forms at least one frame that surrounds the at least one active region and mechanically connects the first glass plate with the second glass plate and seals the at least one active region. The bonding material absorbs near infrared radiation. The organic light-emitting device further includes spacer particles that have a mean diameter that maintains a height between the first and the second glass plates.

In one embodiment, the spacer particles are selectively disposed in areas without the at least one active region. In another embodiment, the spacer particles include a non-conductive material. In still another embodiment, the second glass plate includes a coating on a side facing the first glass plate, and the coating includes the spacer particles. In yet another embodiment, a thickness of the coating excluding the spacer particles is smaller than the mean diameter of the spacer particles. In another embodiment, the spacer particles are disposed on the first glass plate and are covered by the organic layer. In still another embodiment, the spacer particles are disposed on the first glass plate in an area atop the at least one active region.

According to another aspect, the invention involves an organic light-emitting device. The organic light-emitting device includes at least one active region comprising at least one organic layer, a first glass plate on which the at least one active region is applied, and a second glass plate. The at least one active region is disposed between the first and the second glass plates. The first and the second glass plates are at least partially transparent in the near infrared spectral range. The organic light-emitting device further includes a bonding material that includes a solder glass and is disposed between the first and the second glass plates. The bonding material forms at least one frame that surrounds the at least one active region and mechanically connects the first glass plate with the second glass plate and seals the at least one active region. The bonding material absorbs near infrared radiation. The organic light-emitting device further includes at least one getter material which binds harmful atmospheric gases and is disposed between the first and the second glass plates and within the frame.

In one embodiment, the getter material includes an alkaline earth metal. In another embodiment, the said getter material forms a layer that covers the at least one active region. In still another embodiment, the getter material includes Barium. In yet another embodiment, the getter material forms a ring and is disposed in an area between the at least one active region and the bonding material. In another embodiment, the getter material has a height equal to the height between the first and the second glass plates. In still another embodiment, the organic light-emitting device further includes a protective layer disposed between the getter material and the first glass plate. In another embodiment, the ring of the getter material includes a plurality of getter patches separated by channels. In yet another embodiment, the protective layer includes an insulating material.

According to still another aspect, the invention involves an organic light-emitting device. The organic light-emitting device includes a plurality of active regions. Each of the plurality of active regions includes at least one organic layer. The organic light-emitting device further includes a first glass plate on which the plurality of active regions is applied, and a second glass plate. The plurality of active regions are disposed between the first and the second glass plates. The first and the second glass plates are at least partially transparent in the near infrared spectral range. The organic light-emitting device further includes a bonding material that includes a solder glass and is disposed between the first and the second glass plates. The bonding material defines areas that are separated by parallel horizontal and parallel vertical lines of the bonding material. Each of the areas includes at least one of the plurality of the active regions. The bonding material mechanically connects the first glass plate with the second glass plate and seals the active regions. The bonding material absorbs near infrared radiation.

In one embodiment, the areas are separated by double-lines of the bonding material. In another embodiment, each of the areas includes at least two of the plurality of active regions. In still another embodiment, the organic light-emitting device further includes pillars separating the at least two of the plurality of active regions within each of the areas. In yet another embodiment, the pillars are of a height that maintains a height between the first and the second glass plate. In another embodiment, the first and the second glass plates are transparent in the near infrared spectral range from 0.8 μm to 1.5 μm. In still another embodiment, the organic light-emitting device further includes first electrodes located on the first glass plate and second electrodes located atop the plurality of active regions such that the first electrodes are arranged in vertical lines and the second electrodes are arranged in horizontal lines. In yet another embodiment, the organic light-emitting device further includes spacer particles having a mean diameter that maintains a height between the first and the second glass plates. In another embodiment, the organic light-emitting device further includes at least one getter material, which binds harmful atmospheric gases and which is located between the first and the second glass plate and within at least one of the areas.

DETAILED DESCRIPTION OF THE PREFERRED EMBODIMENTS

Figure 1:
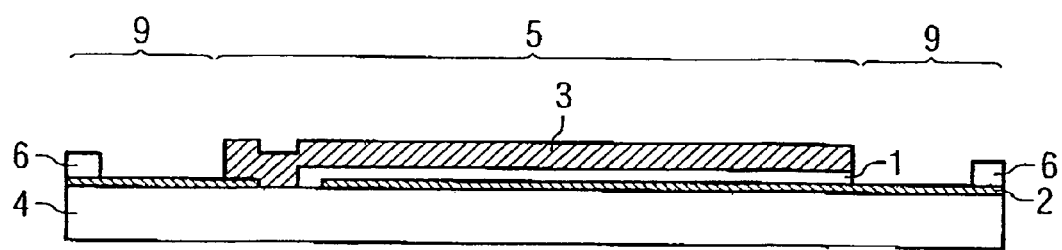
FIGS. 1 to 3 are illustrative schematic sectional views of an OLED-device according to the invention at different fabrication steps.
Figure 2:
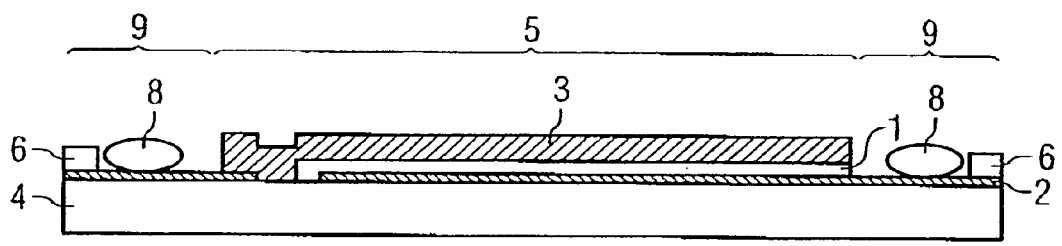
Figure 3:
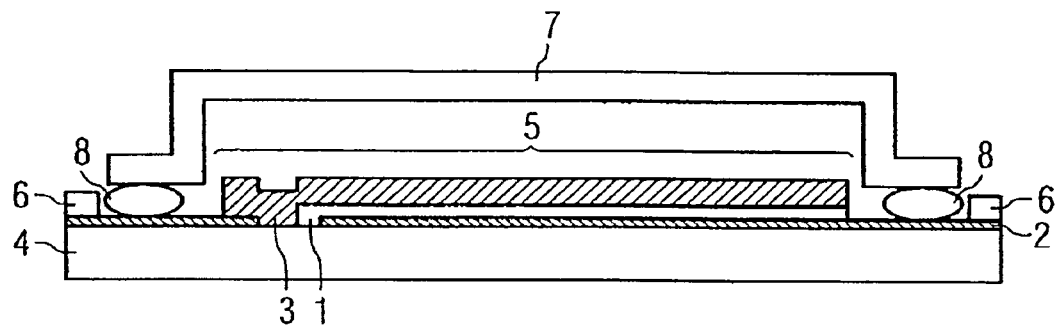

In accordance with one embodiment of the invention, FIGS. 1, 2 and 3 show cross-sectional views of an OLED-device at different process steps. Referring to FIG. 1, the OLED-device comprises one or more active organic layers 1 with organic active material sandwiched between two electrodes 2, 3 formed on a substrate 4 in an active region 5. Electrical connections to the electrodes 2, 3 can be made by bond wires via bond pads 6. When an electrical current is applied to the OLED-device, electrons and holes are injected into the organic material of the active organic layer 1 by the electrodes 2, 3. The charge carriers recombine within the active organic layers 1 and the released energy is emitted as visible light.

To form a pixel matrix of a display, the upper and lower electrode 2, 3 can be patterned in strips perpendicular to each other. For the patterning of the upper electrode 3, pillars, preferably with an overhanging structure, can be used. The patterning of electrodes is described in U.S. Pat. No. 6,699,728, U.S. Pat. No. 6,696,312, and U.S. Pat. No. 6,784,009, which are incorporated by reference herein for all purposes.

Usually the lower electrode 2 adjacent to the substrate 4 acts as an anode forming an electrical contact with ohmic characteristics to the adjacent active organic material of the active organic layer 1 and injects holes into it. Preferably, the anode 2 comprises a material with high work function for electrons and good transparency for the light emitted by the OLED-device. A suitable material for the anode 2 is, for example, Indium-Tin-Oxide (ITO).

As substrate 4, a glass plate or a plate based on polymeric plastic material can be used. In order to reduce the overall thickness of the OLED-device as far as possible, a thin substrate 4 is often used. Polymeric plastic materials, for example foil, are particularly useful for the fabrication of flexible OLED-devices. Examples for these materials are poly(ethylene terephthalate) (PET), poly(butylene terephthalate) (PBT), poly(enthylene naphthalate) (PEN), polycarbonate (PC), polyimides (PI), polysulfones (PSO), poly(p-phenylene ether sulfone) (PES), polyethylene (PE), polypropylene (PP), poly(vinyl chloride) (PVC), polystyrene (PS) and poly(methyl methyleacrylate) (PMMA).

The active organic layers 1 can comprise one or more hole injection layers, preferably adjacent to the anode 2 with reduced injection barrier for holes. Furthermore, the active organic layers 1 can comprise one or more hole transportation layers, one or more electron transportation layers and at least one emission layer. As active organic material of the active organic layers 1, small molecules or polymeric material can be used. Materials based on small molecules are usually deposited by evaporation, while polymeric materials are usually deposited by solvent processes like doctor-blading, spin-coating, printing processes or other common solvent processes.

The upper electrode 3 opposite the lower electrode 2 usually serves as a cathode. To minimize the injection barrier for electrons, the cathode 3 is preferably comprises a metal or a compound material with a low work function for electrons. Such materials are generally sensitive to corrosion or other degenerating mechanisms. For OLED-devices with polymeric active organic material, metals like Ca or Ba are often used for the cathode 3. In order to protect these sensitive materials against external influences such as atmospheric gases and to guarantee a good electrical contact, a layer of Al or Ag (not shown) is placed on top of cathode 3.

Besides the cathode 3, the active organic layer 1 can also be impaired by external influences. Therefore, the active regions 5 comprising the electrode layers 2, 3 and the active organic layer 1 are encapsulated with a cap 7 as hermetically as possible. As cap 7, a glass plate or a metal part can be used. Furthermore, the cap 7 should be mounted without direct contact to the active organic layer 1 or electrodes 2, 3 to avoid causing any damage to these functional parts of the OLED-device. To avoid direct contact between the active organic layer 1 and the cap 7, the cap has a cavity corresponding to the active region 5 of the OLED-device. Alternatively, it is also possible to use a plane plate as cap 7. The use of a plane plate as cap 7, which is in direct contact with the active organic layer 1 can improve the encapsulation of the device, since the active organic layer 1 is not in contact with air.

For the encapsulation of the OLED-device, a thermally curable bonding material 8 such as epoxy adhesive or solder glass is deposited on a sealing region 9 of the substrate 4 (FIG. 2) surrounding the active region 5 with the functional parts of the OLED-device. Further, the active region 5 can comprise support posts or spacer particles to avoid contact between the cap 7 and the functional parts in the active region 5. The use of spacer particles for the encapsulation of OLED-devices is described in documents WO 01/45140 and WO 01/44865, which are incorporated herein by reference for all purposes. If spacer particles or support posts are used, it can be helpful to deposit the bonding material 8 on the support posts or spacer particles as well. Alternatively or additionally, the bonding material 8 can be deposited on the regions of the cap 7 which will contact the substrate 4 after assembly. The bonding material 8 can be deposited by means of dispensing or printing methods, for example screen printing.

After depositing the bonding material 8, the cap 7 is mounted onto the substrate 4 as shown in FIG. 3. If epoxy adhesive is used as bonding material 8, an initial UV-irradiation step may be necessary to initiate the curing process.

Subsequently, the bonding material 8 is cured by applying a broadband near infrared radiation 10 with wavelengths centered in the range of 0.8 to 1.5 µm. This sort of near infrared radiation 10 is particularly suited to achieve a homogenous drying or curing of polymeric adhesives and avoids an overheating of the polymeric surface of the adhesive sometimes caused by other kinds of infrared radiation 10. A further characteristic of this process is that very high energy densities up to 1.5 MW/m$^3$ can be used, which considerably reduces the time required for curing the bonding material.

Since the bonding material 8 is sandwiched between the cap 7 and the substrate 4, it is necessary for the application of the near infrared radiation 10 that at least the cap 7 or the substrate 4 is made of a material transparent to near infrared radiation 10, such as glass, and a near infrared source 11 emitting the near infrared radiation 10 is positioned on the side of the transparent material in such a way that the infrared radiation 10 can reach the bonding material 8

Figure 4:
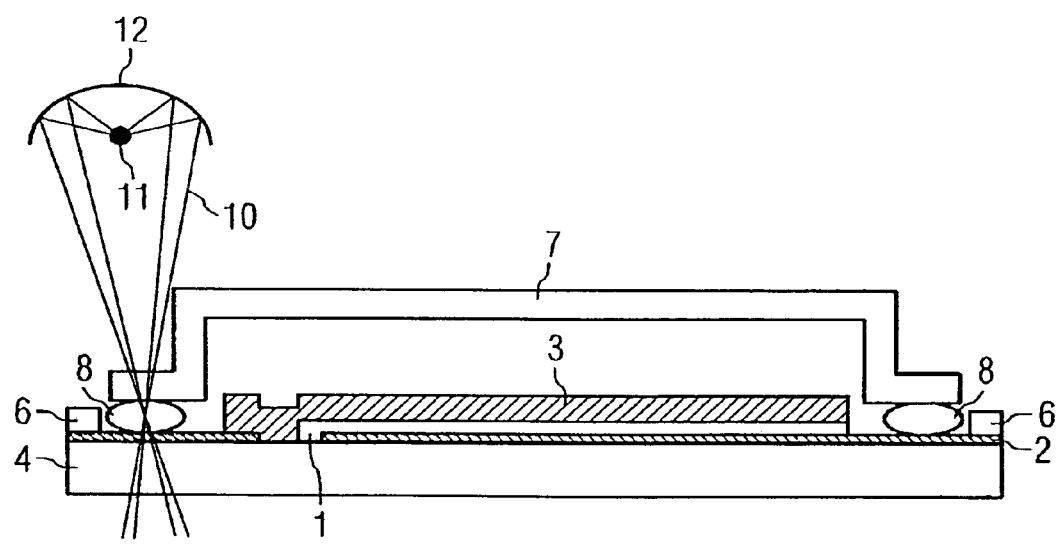
FIGS. 4 to 6 are illustrative schematic sectional views of an OLED-device during curing of bonding material with the help of near infrared radiation.

In one embodiment of the invention, the near infrared radiation 10 is focused to yield a radiation spot with a diameter of 5 mm or a line focus with a confinement of 1 to 2 mm. Preferably, the near infrared radiation 10 emitted by the near infrared radiation source 11 is focused, for example by means of a reflector 12, in such a way that the maximum energy density is located inside the bonding material 8 as schematically shown in FIG. 4.

Figure 5:
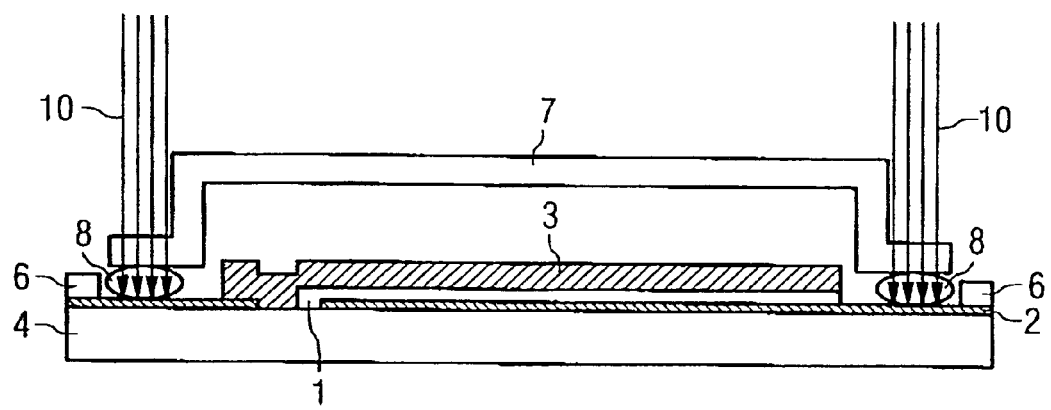

In another embodiment of the invention, non-focused near infrared radiation 10 is used to cure the bonding material 8 as schematically shown in FIG. 5.

Figure 6:
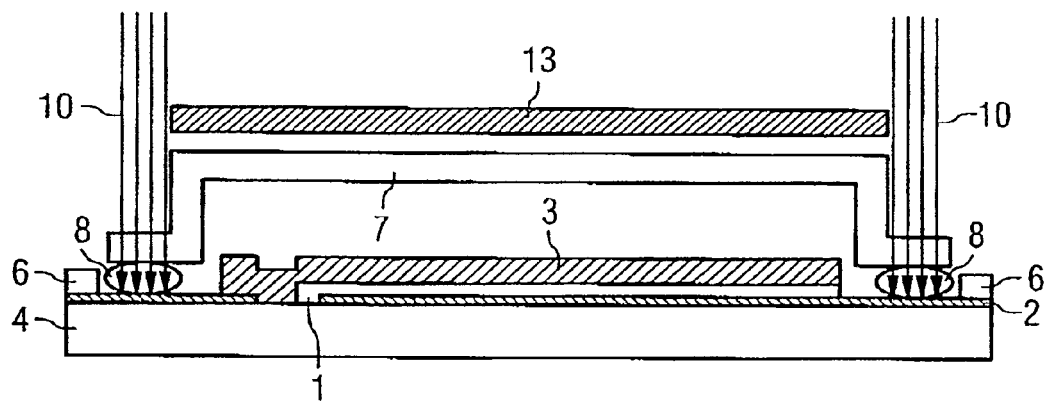

To protect the active organic layer of the OLED-device against residual near infrared radiation 10, it can be helpful to use a shadow mask 13. It can be used in connection with unfocussed near infrared radiation 10, as schematically shown in FIG. 6, or focused near infrared radiation 10 (not shown).

To avoid damage of the active organic layer or other functional parts of the OLED-device by permeating harmful atmospheric gases, the active region can comprise a getter material, for example Ba, which can bind them chemically or physically. The getter material can be arranged for example as a layer (not shown) on the surface of the cap arranged opposite the active region. The getter material can also be included in the bonding material 8. Getter materials for OLED-devices are described in more detail in US published application Nos. 2004-0051449 and US 2004-0048033, which are incorporated herein by reference for all purposes.

FIGS. 7A to 7E show different steps of a batch process using at least one line-focused near infrared source 11 for the encapsulation of several OLED-devices according to one embodiment of the invention.

As described above in more detail, the functional parts of several OLED-devices are processed on a substrate 4.

The bonding material 8 is dispensed or otherwise deposited in rims surrounding the active regions 5 of the OLED-devices and a plurality of caps 7 are positioned above for encapsulation. Furthermore, the plurality of caps 7 can be integrated on a cap substrate, such as a metal or glass plate. The plate can be plane or provide cavities corresponding to the active regions 5 of the OLED-device on the substrate 4.

The bonding material 8 forms rims, which are arranged along, parallel vertical lines and parallel horizontal lines. The rims of the bonding material 8 are deposited in such a way that they define rectangular active regions 5 with width a* and height b* arranged in a regular grid such that adjacent active regions 5 are spaced from each other at a horizontal distance $d_H$ and at vertical distance $d_V$. In the following, the vertical lines are numbered from the left side to the right side by V1 to V8 and the horizontal lines from the bottom to the top by H1 to H6.

To cure the bonding material 8, a near infrared source 11 emitting line-focused radiation is positioned parallel to the outer vertical line V1 of the grid on the left side above the rims formed by the bonding material 8. By shifting the near infrared source 11 by the distance a* to the right, the next line V2 of bonding material 8 is cured. In a subsequent step, the radiation source 11 is shifted by the distance $d_H$ to the right to start curing the bonding material 8 surrounding the next array of OLED-devices with the vertical line V3. Instead of shifting the near infrared source 11 to the right, it is also possible to shift the substrate 4 to the left. In the same way as the rims of bonding material 8 limiting the vertical sides of the rectangular areas are cured, the rims of bonding material 8 limiting the horizontal sides of the rectangular areas can be cured in subsequent steps.

Figure 7A:
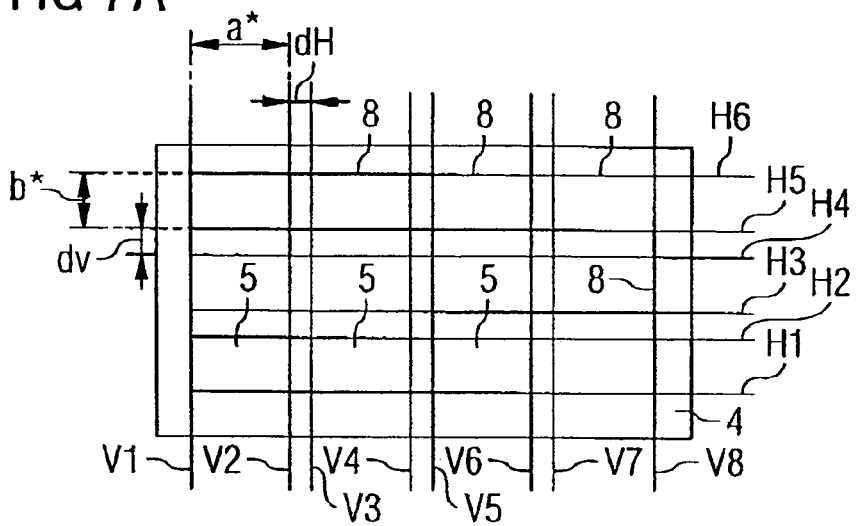
FIGS. 7A to 7E are illustrative schematic top views of OLED-devices according to the invention at different fabrication steps of a batch process.
Figure 7B:
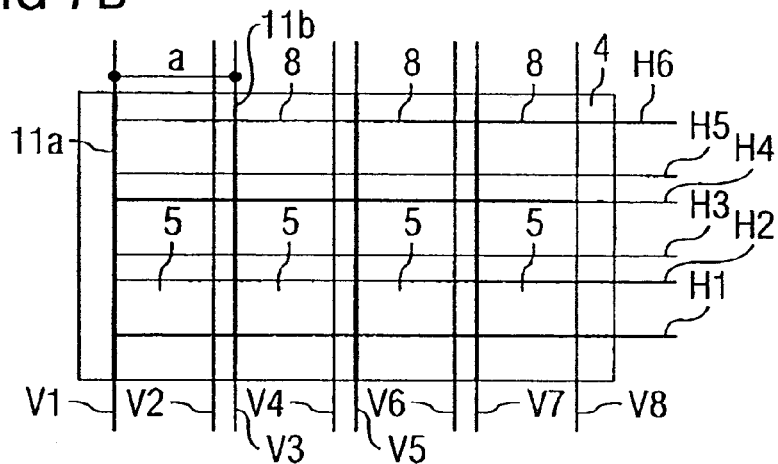
Figure 7C:
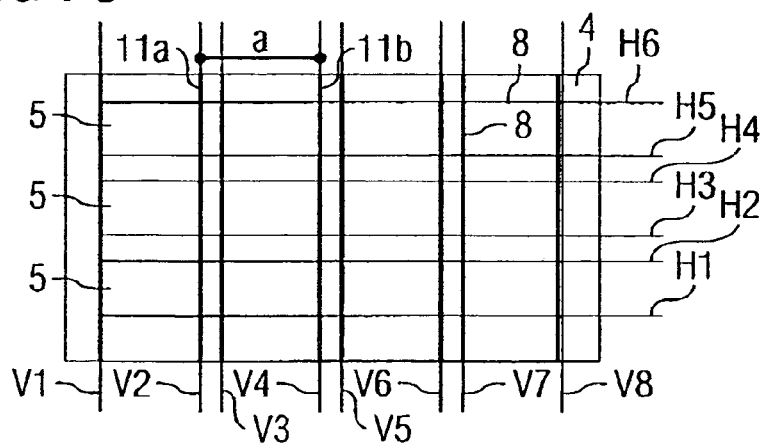

If the horizontal and vertical distances $a=a*+d_H$ and $b=b*+d_V$ are large enough to position two near infrared wire sources 11a and 11b parallel to each other within these distances, the number of irradiation steps can be reduced. For example, for near infrared wire sources of the Company Adphos, the minimum distance between two line-focused wire sources is 50 mm. As shown in FIG. 7B, the vertical lines V1 and V3 limiting adjacent active regions can be cured in a single step by means of two vertical infrared wire sources 11a and 11b arranged parallel to each other. By shifting the near infrared wire sources 11a, 11b by the distance 2a to the left (or the substrate to the right), the vertical lines V5 and V7 the bonding material 8 can be cured in a subsequent step (see FIG. 7B). In the next step the near infrared wire sources 11a, 11b are positioned in such a way that the infrared wire source 11a is parallel above the vertical line V2 and that the infrared wire source 11b is parallel to the vertical line V4 to cure them. The other vertical lines V6 and V8 of bonding material 8 are cured by shifting the infrared wire sources 11a, 11b to the right (or the substrate to the left) by the distance 2a (see FIG. 7C). The distances a, a*, b and b* can have values of a few mm up to several cm.

Figure 7D:
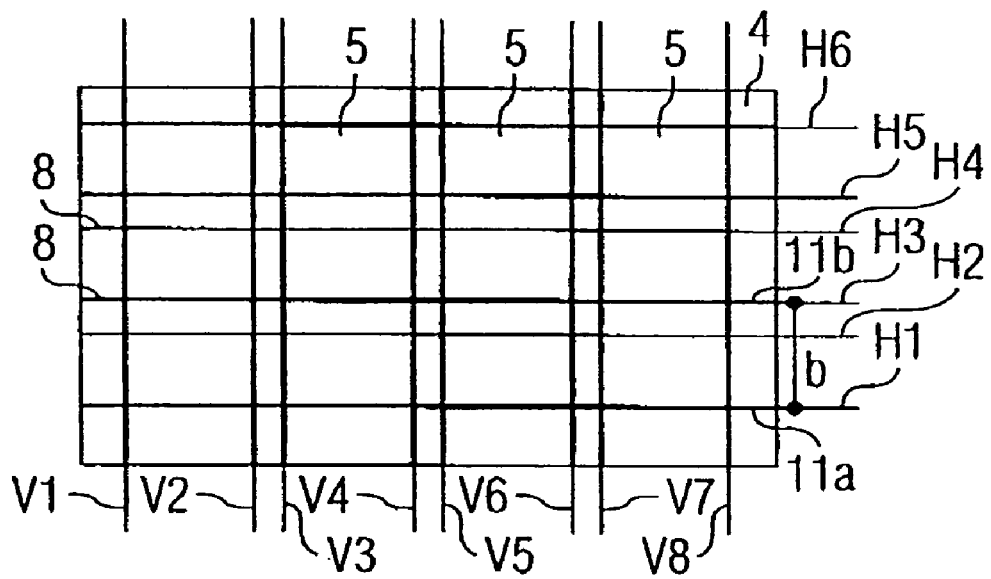
Figure 7E:
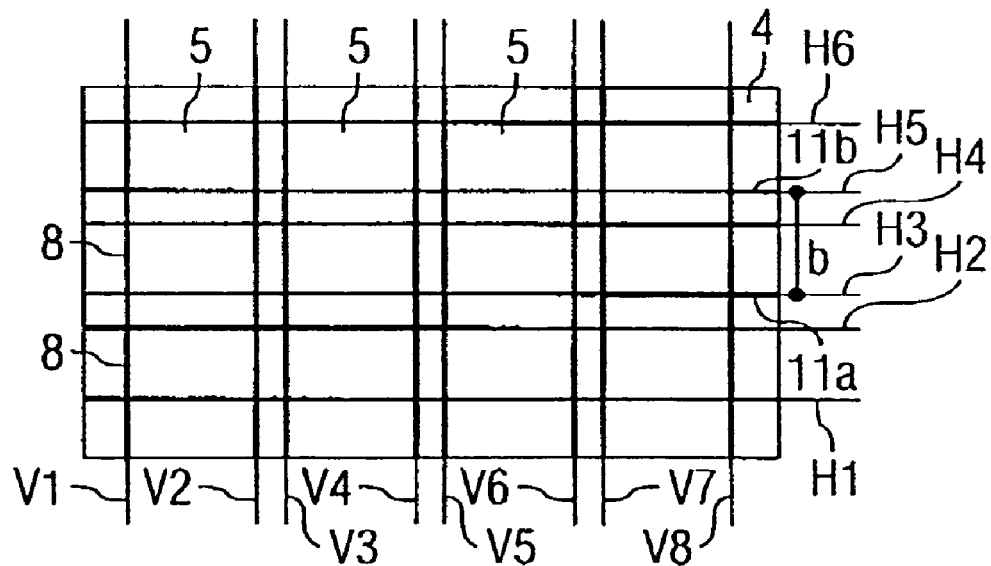

The curing of the horizontally arranged rims of bonding material 8 forming the horizontal lines H1 to H6 by means of two horizontal wire sources 11a and 11b arranged parallel to each other at a distance b is shown in FIGS. 7D and 7E. As described for the vertical lines V1 to V8 of the bonding material 8, the horizontal lines H1 to H6 of bonding material 8 can be cured in subsequent steps by shifting the near infrared wire sources 11a, 11b or the substrate 4.

In a first step, the infrared wire sources 11a, 11b are positioned in such a way above the bonding material 8 that the wire source 11a is positioned parallel above the horizontal line H1 and the wire source 11b is positioned parallel above the horizontal line H3. After curing the horizontal lines H1 and H3, the near infrared wire sources 11a, 11b are shifted to the top by the distance 2b and the horizontal line H5 is cured. Equivalently to the curing of the vertical lines V1 to V8, the near infrared wire sources 11a, 11b are then positioned in such a way that the wire source 11a is positioned parallel above the horizontal line H2 and the wire source 11b is positioned parallel above the horizontal line H4 (see FIG. 7D). By shifting the near infrared wire sources 11a, 11b to the top by the distance 2b (or the substrate to the bottom) the remaining horizontal line H6 can be cured (see FIG. 7E).

After curing all rims of bonding material 8, the OLED-devices can be separated, for example by sawing.

The method for encapsulation is not limited to OLED-devices. Furthermore, it is particularly suited for the encapsulation of organic solar cells or organic photodetectors.

The scope of the invention is not limited to the examples given hereinabove. The invention is embodied in each novel characteristic and each combination of characteristics, which particularly includes any combination of the features, which are described in the claims, even if this feature or this combination of features is not explicitly referred to in the claims or in the examples.

What is claimed is:

1. An organic light-emitting device, comprising:
   at least one active region comprising at least one organic layer;
   a first glass plate on which the at least one active region is applied;
   a second glass plate, said at least one active region being disposed between said first and said second glass plates, said first and said second glass plates being at least partially transparent in the near infrared spectral range;
   a bonding material comprising a solder glass and disposed between said first and said second glass plates, said bonding material forming at least one frame that surrounds said at least one active region and mechanically connecting said first glass plate with said second glass plate and sealing said at least one active region, said bonding material absorbing near infrared radiation; and
   spacer particles having a mean diameter that maintains a height between said first and said second glass plates,
   wherein said second glass plate comprises a coating on a side facing said first glass plate, said spacer particles being embedded in said coating;
   wherein a thickness of said coating excluding said spacer particles is smaller than the mean diameter of said spacer particles; and
   wherein said spacer particles are disposed only in areas without the at least one active region.

2. The device of claim 1, wherein said spacer particles comprise a non-conductive material.

3. The device of claim 1, wherein said spacer particles are disposed on said first glass plate and are covered by said organic layer.

4. The device of claim 1, wherein said spacer particles are disposed on said first glass plate in an area atop the at least one active region.

5. An organic light-emitting device, comprising:
   a plurality of active regions, each of the plurality of active regions comprising at least one organic layer;
   a first glass plate on which the plurality of active regions is applied;
   a second glass plate, said plurality of active regions being disposed between said first and said second glass plates, said first and said second glass plates being at least partially transparent in the near infrared spectral range; and
   a bonding material comprising a solder glass and disposed between said first and said second glass plates, said bonding material defining areas that are separated by parallel horizontal and parallel vertical lines of said bonding material, each of said areas comprising at least one of the plurality of the active regions, said bonding material mechanically connecting said first glass plate with said second glass plate and sealing said active regions, said bonding material absorbing near infrared radiation,
   wherein said areas are separated by double-lines of said bonding material,
   wherein said parallel horizontal and parallel vertical lines that form said double-lines are continuous lines; and
   wherein the continuous lines are formed as separate straight lines which intersect each other to form a regular grid.

6. The device of claim 5, wherein each of said areas comprises at least two of the plurality of active regions.

7. The device of claim 6 further comprising pillars, said pillars separating said at least two of the plurality of active regions within each of said areas.

8. The device of claim 7, wherein said pillars are of a height that maintains a height between said first and said second glass plate.

9. The device of claim 5, wherein said first and said second glass plates are transparent in the near infrared spectral range from 0.8 µm to 1.5 µm.

10. The device of claim 5 further comprising first electrodes located on said first glass plate and second electrodes located atop the plurality of active regions such that said first electrodes are arranged in vertical lines and said second electrodes are arranged in horizontal lines.

11. The device of claim 5 further comprising spacer particles having a mean diameter that maintains a height between said first and said second glass plates.

12. The device of claim 5 further comprising at least one getter material, which binds harmful atmospheric gases and which is located between said first and said second glass plate and within at least one of said areas.

* * * * *